(12) United States Patent
Jain et al.

(10) Patent No.: US 8,476,760 B2
(45) Date of Patent: Jul. 2, 2013

(54) ELECTROPLATED POSTS WITH REDUCED TOPOGRAPHY AND STRESS

(75) Inventors: Manoj K. Jain, Plano, TX (US); Sreenivasan Koduri, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 15 days.

(21) Appl. No.: 13/288,161

(22) Filed: Nov. 3, 2011

(65) Prior Publication Data

US 2012/0112343 A1     May 10, 2012

Related U.S. Application Data

(60) Provisional application No. 61/409,588, filed on Nov. 3, 2010.

(51) Int. Cl.
*H01L 23/48* (2006.01)
*H01L 21/00* (2006.01)
*H01L 21/44* (2006.01)

(52) U.S. Cl.
USPC ........... 257/737; 257/762; 257/778; 257/782; 257/E23.02; 257/E23.021; 438/108; 438/613; 438/678

(58) Field of Classification Search
None
See application file for complete search history.

(56) References Cited

U.S. PATENT DOCUMENTS

| | | | |
|---|---|---|---|
| 2004/0005771 A1* | 1/2004 | Fan et al. | 438/613 |
| 2005/0218510 A1* | 10/2005 | Farnworth et al. | 257/723 |
| 2007/0246133 A1* | 10/2007 | Helneder et al. | 148/518 |
| 2009/0026608 A1* | 1/2009 | Tsai et al. | 257/737 |
| 2010/0155937 A1* | 6/2010 | Hsu et al. | 257/737 |

\* cited by examiner

*Primary Examiner* — Julio J Maldonado
*Assistant Examiner* — Harpreet Singh
(74) *Attorney, Agent, or Firm* — Wade J. Brady, III; Frederick J. Telecky, Jr.

(57) ABSTRACT

Bond pads on an integrated circuit are provided with planarizing dielectric structures to permit the electroplating of metal posts having planar top surfaces. The metal posts contact at least three sides of the planarizing dielectric structures. The planarizing dielectric structures can be used on integrated circuits having bond pads of different sizes to electroplate metal posts having the same height.

6 Claims, 5 Drawing Sheets

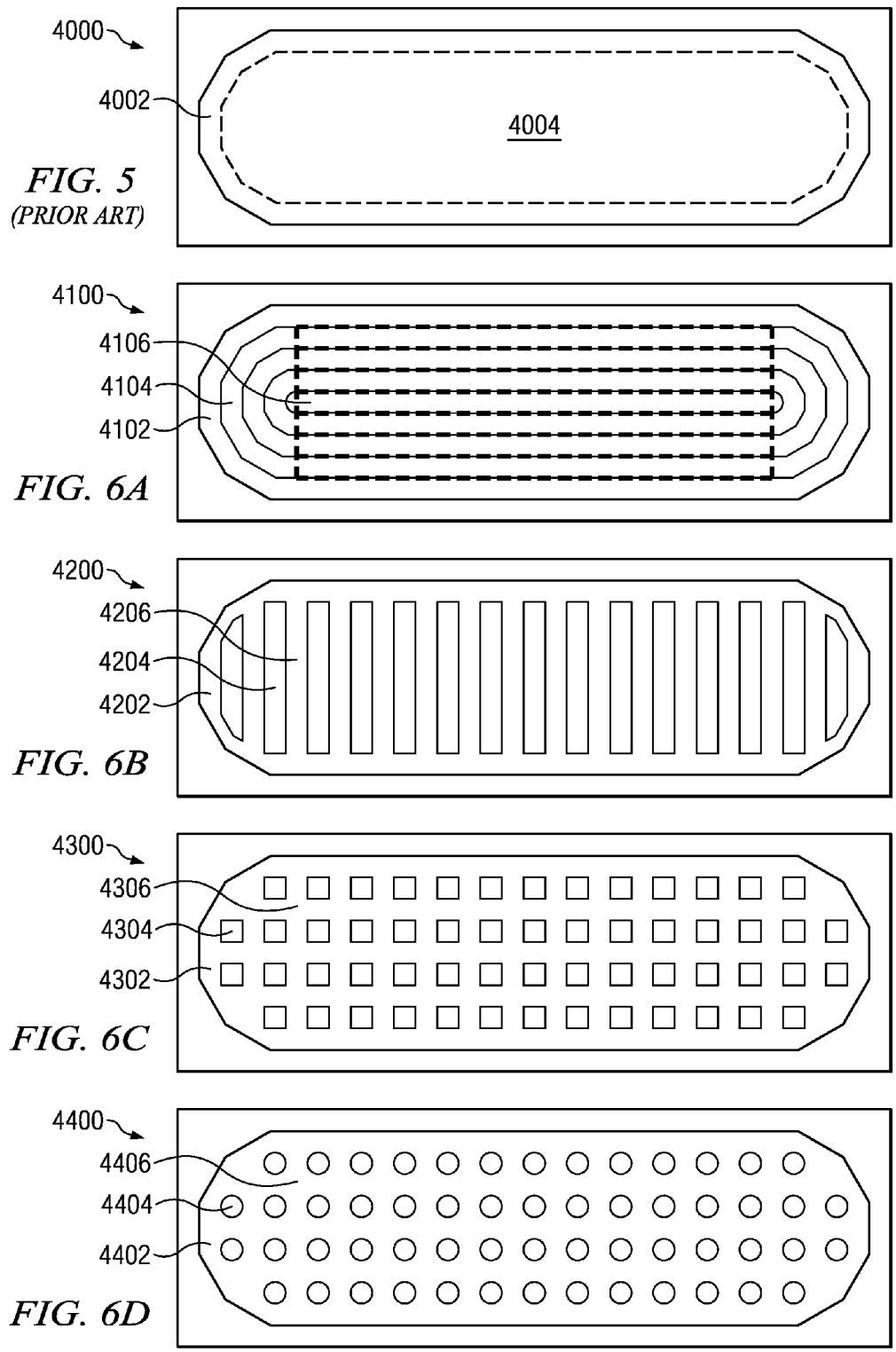

ELECTROPLATED POSTS WITH REDUCED TOPOGRAPHY AND STRESS

This application claims the benefit of U.S. Provisional Application No. 61/409,588, filed Nov. 3, 2010, the entirety of which is herein incorporated by reference.

FIELD OF THE INVENTION

This invention relates to the field of integrated circuit packaging. More particularly, this invention relates to flip chip bonding of an integrated circuit chip.

BACKGROUND OF THE INVENTION

After a semiconductor integrated circuit chip has been manufactured it must be affixed to a leadframe or package substrate. Connections are made between the bond pads of the chip and the leadframe or package substrate to enable electrical signals to be transmitted between the integrated circuit and the leadframe or package substrate. One way of making these connections is flip chip bonding where solder balls are formed on the bond pads of the chip and then the chip is inverted and a solder joint is formed to the leadframe or package substrate. In one flip chip solder joint attachment method, metal posts (usually copper) are first electroplated on top of the integrated circuit chip bond pads. The chip is then inverted and the electroplated posts are soldered to the lead frame or package substrate. The copper post technology has two problems. First, the surface of the electroplated copper post is not planar. This may cause in voids in the solder joint between the post and the leadframe or package substrate. The voids may result in a poor electrical contact and also may result in a reliability failure. Second, different area posts grow vertically (electroplate) at different rates resulting in posts with different heights. This makes it difficult to form uniform solder joints between the tops of the posts and the planar lead frame or package substrate.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The invention relates to the formation of metal posts having substantially planar top surfaces on bond pads of an integrated circuit by electroplating over planarizing dielectric structures formed on the bond pads. The size of the planarizing structures may be adjusted to provide the best compromise between current carrying capability and the planarity of the top of the post. The planarizing dielectric structues may also act as a stress buffer layer and may relieve stress between the electroplated post and the bond pad. The invention also provides a method for simultaneously forming electroplated posts on bond pads of different sizes so that the posts have substantially the same height and substantially planar top surfaces.

DESCRIPTION OF THE VIEWS OF THE DRAWING

FIG. 5 is an example of a conventional dielectric pattern for forming metal posts on large bond pads.

FIG. 6A through 6D are examples of dielectric patterns according to embodiments of the invention for forming metal posts on large bond pads.

DETAILED DESCRIPTION

Figure 1A:
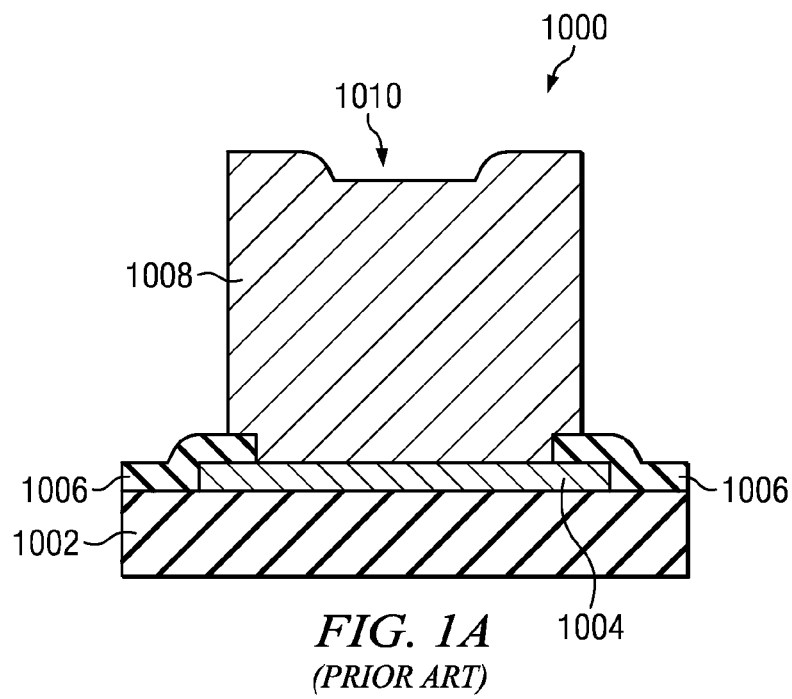
FIG. 1A through FIG. 1C show conventional electroplated metal posts for flip-chip integrated circuits.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

FIG. 1A shows a copper post 1008 formed by a conventional process. The copper post is electroplated on top of bond pad 1004 which is formed on semiconductor substrate 1002 of integrated circuit chip 1000. A dielectric film 1006, is deposited over the bond pad and then was patterned and etched to form an opening in the dielectric layer on top of the bond pad 1004. The bond pad 1004 may be formed of a metal such as AlCu alloy. The copper post 1008 is formed by electroplating. As can be seen in FIG. 1, the top surface 1010 of the copper post is not planar. A depressed area in the top center of the post 1008 is formed during the conventional electroplating process.

Figure 1B:
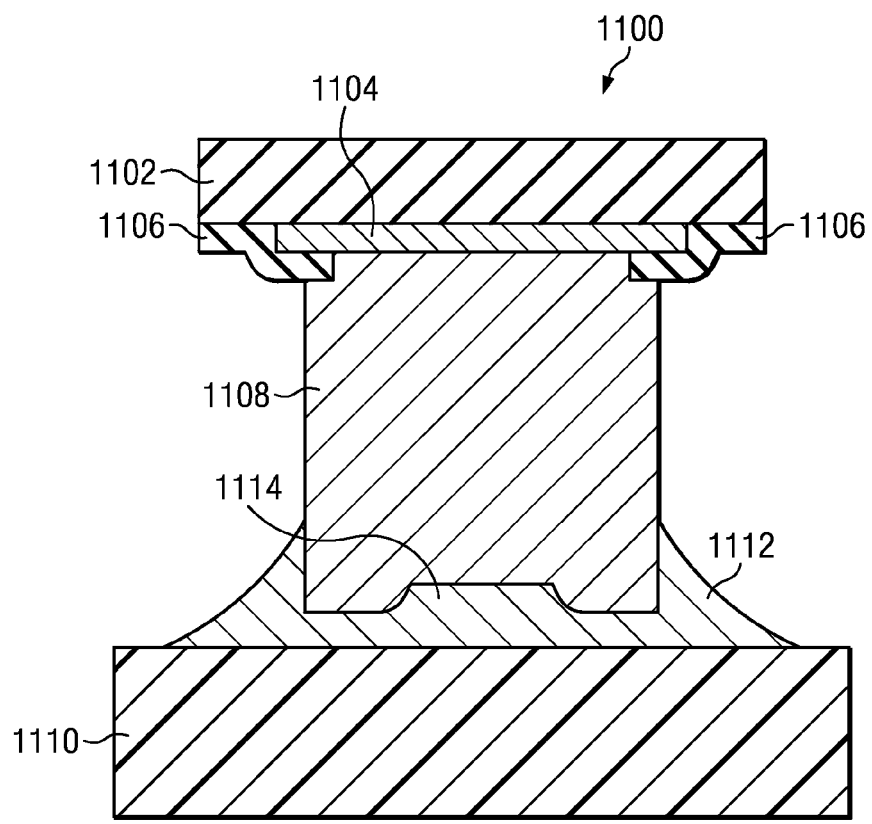
Figure 1C:
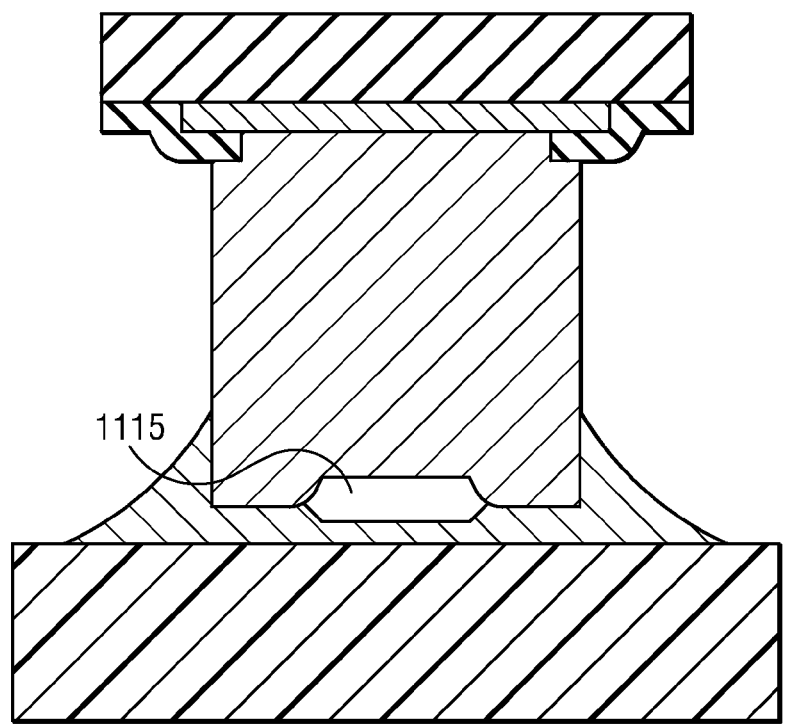

FIGS. 1B and 1C show an integrated circuit chip 1102 with a copper post 1108 formed using a conventional process with flip-chip attachment to a lead 1111 on lead frame 1110 using solder 1112. FIG. 1B and FIG. 1C show examples of a good attachment, with no void in region 1114, and a poor attachment, with a void 1115, respectively. The solder 1112 sometimes has difficulty wetting the non planar copper post allowing a void 1115 to form during the solder joint formation. This may result in a poor electrical connection and may also result in a reliability failure.

FIGS. 2A through 2D describe the structure and method for forming metal posts with substantially planar tops according to embodiments of the invention.

Figure 2A:
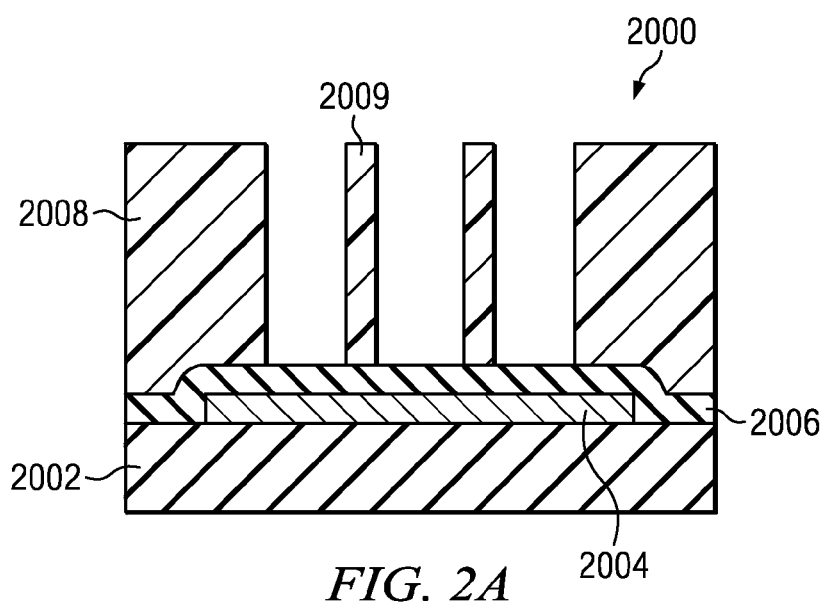
FIG. 2A through FIG. 2E are illustrations of steps in the fabrication of integrated circuits according to an embodiments of the invention.

In FIG. 2A, bond pad 2004 overlies semiconductor substrate 2002 of integrated circuit 2000. Dielectric layer 2006 such as polyimide (PI), polybenzoxazole (PBO), or benzocyclobutene (BCB) is deposited over the bond pad 2004. Thickness of the bond pad is typically 3000 nm to 15000 nm and thickness of the overlying dielectric film is typically also 3000 nm to 15000 nm. A photoresist pattern 2008 is formed on dielectric layer 2006 with openings over the bond pad 2004 where the dielectric 2006 is to be removed. Resist structures 2009 protect the dielectric 2006 where planarizing structures are to be formed. The dielectric may also be a photosensitive polymer in which the pattern may be formed without resist.

Figure 2B:
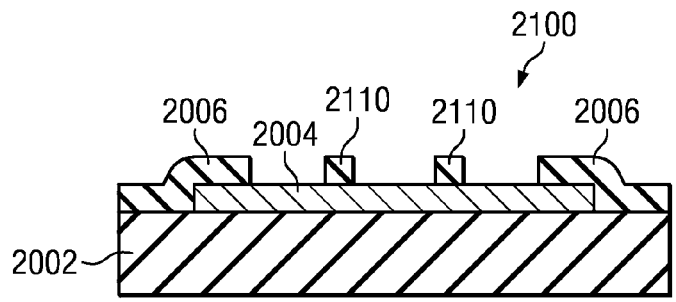

The dielectric 2006 in the exposed regions is then removed either by etching, or if a photosensitive polymer is used by developing, to form planarizing dielectric structures 2110 in the structure 2100 shown in FIG. 2B. Planarizing structures 2110 are designed to assist in producing a substantially planar top surface of the metal post during the electroplating process. The planarizing structures 2110 can be sized larger to provide a more planar surface or smaller to provide more copper post area for high current applications.

Figure 2C:
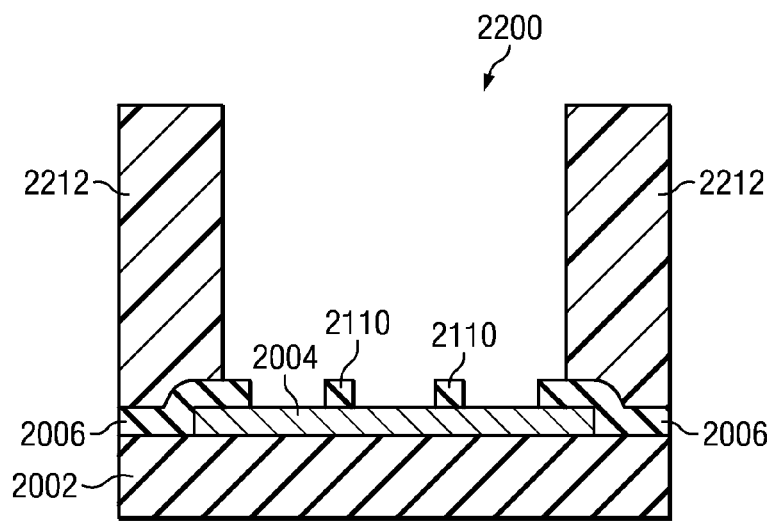

Referring to FIG. 2C, an electroplating layer 2212 is deposited over the bond pad 2004 with an opening over the bond pad 2004 within which a metal post will be electroplated. Electroplating layer 2212 may be photoresist which may later be removed after the post is formed or it may be polyimide that may remain in place after the copper post is formed. In the present embodiment a 60 um to 90 um thick photoresist is used for the electroplating layer 2212.

Figure 2D:
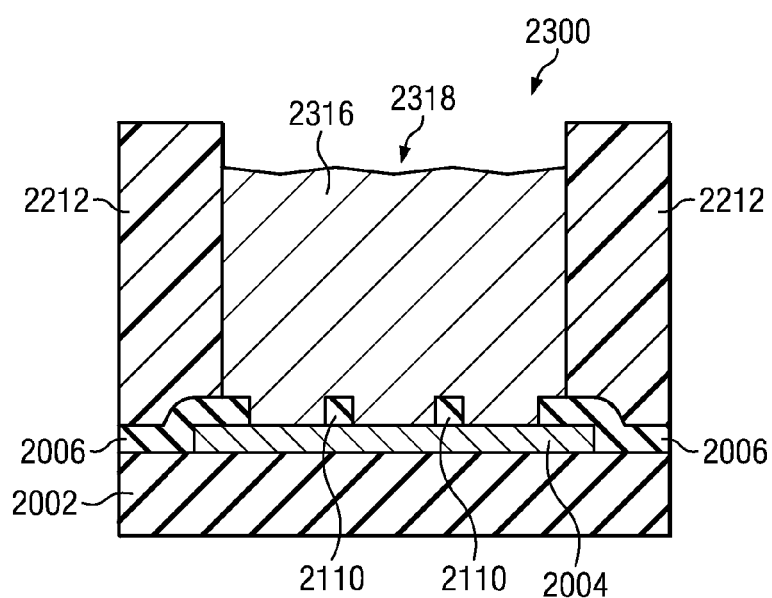

In FIG. 2D, a metal post 2316, formed of copper, for example, approximately 50 um tall is electroplated on top of bond pad 2004. Dielectric geometries 2110 alter the topography of the top surface 2318 of the copper post during electroplating to be substantially planar.

Figure 2E:
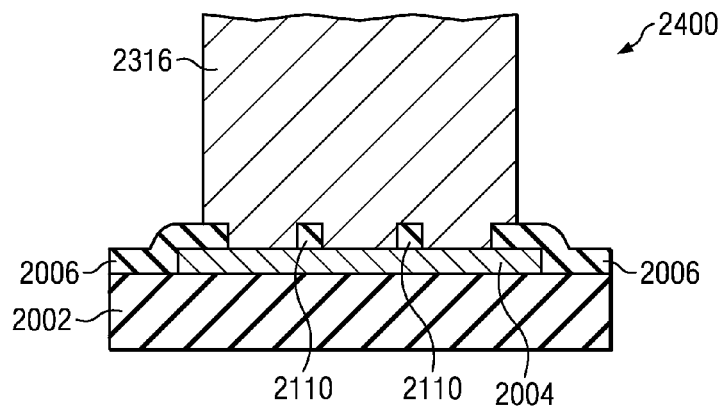

In FIG. 2E, pattern 2212, if formed of photoresist, is removed prior to flip chip solder joint attachment to a lead frame. Alternatively pattern 2212, if formed of a material such as polyimide may be left in place after the copper post is formed. In this case a plasma ash is typically used to reduce the polyimide thickness to expose the top of the copper post 2316 prior to flip chip solder joint formation.

An additional advantage of the planarizing structures 2110 is that they also act as a stress buffer layer between the electroplated post 2316 and the bond pad 2004. Stress between the electroplated post and the bond pad may cause the post to delaminate from the bond pad. The stress between a large electroplated post and the underlying large bond pad may be reduced with embedded planarizing structures 2110. The reduction in stress may improve reliability by reducing the number of stress related failures that may occur over the lifetime of the integrated circuit.

Figure 3:
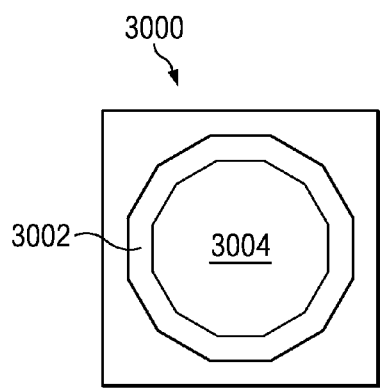
FIG. 3 is an example of a conventional dielectric pattern for forming electroplated metal posts.
Figure 4A:
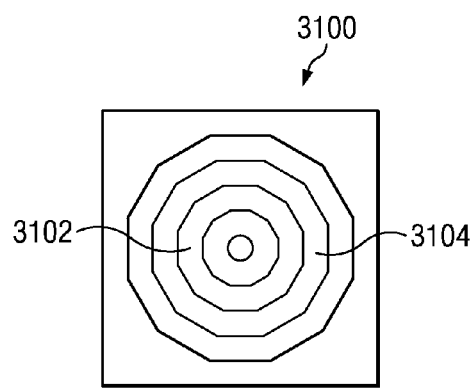
FIG. 4A through 4D are examples of dielectric patterns according to embodiments of the invention for forming metal posts.
Figure 4B:
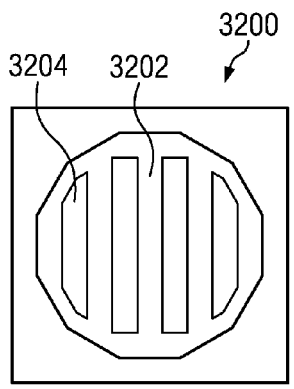
Figure 4C:
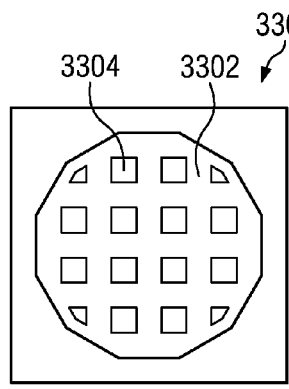
Figure 4D:
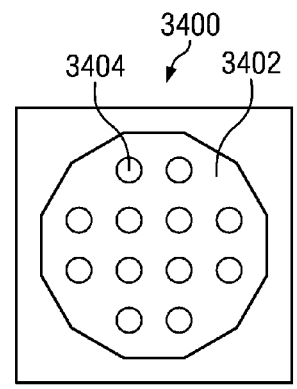

FIG. 3 shows a conventional dielectric pattern on top of a circular bond pad 3000 according to prior art. The surface of the bond pad 3000 has an outer region that is covered by a dielectric pattern 3002 and an inner region 3004 where the surface of the bond pad is exposed for electroplating. The exposed inner region 3004 may be 30 um to 150 um or more in diameter.

FIGS. 4A through 4D show various dielectric patterns according to embodiments of the invention for producing planarizing dielectric structures on the bond pad prior to electroplating. While a circular bond pad is shown for purposes of illustration it is understood that other bond pad shapes may also be used. Dielectric patterns 3102 and 3202 in FIGS. 4A and 4B, respectively, expose bond pad regions 3104 and 3204 of relatively large areas on bond pads 3100 and 3200, and are preferred for higher current applications. Dielectric patterns 3300 and 3400 in FIGS. 4C and 4D, respectively, expose bond pad regions 3304 and 3404 of smaller areas on bond pads 3300 and 3400, and are preferred for improved planarity of the copper post.

In conventional processes, an integrated circuit is typically formed with all posts being approximately the same size because different sized posts electroplate at different rates. This results in the larger area posts being shorter than smaller area posts. The difference in post height makes it difficult to form uniform, void free bonds to the lead frame during flip chip bonding. It is therefore desirable to have a process where different size posts electroplate at substantially the same rate.

FIG. 5 shows a conventional dielectric pattern 4002 for electroplating a metal post over a large bond pad 4000. The bond pad may be as little as 30 um wide and may be 1000 um or longer. The top of the bond pad has two regions: one region near the edge of the bond pad that is covered with dielectric pattern 4002 and a second region 4004 where the bond pad metal is exposed for electroplating. The shape of this large bond pad is for illustrative purposes. Other shapes may also be used. In an integrated circuit having both large bond pad 4000 and smaller bond pad 3000 of FIG. 3, for example, if larger bond pad 4000 is electroplated at the same time as smaller bond pad 3000, the copper post on the smaller bond pad 3000 may grow faster than the copper post on the larger bond pad 4000 and consequently be taller at the end of the electroplating process. It is difficult to form high quality, uniform solder joints between copper posts with different heights and a leadframe or package substrate. Another difficulty with electroplating large posts is that significant stress may be generated between the large electroplated post and the underlying bond pad region 4004. This stress may result in delamination between the post and the bond pad region 4004 and may cause reliability failures during the lifetime of the integrated circuit.

FIGS. 6A through 6D show dielectric patterns 4102, 4202, 4302, and 4402, respectively, that overlay large bond pads 4100, 4200, 4300, and 4400 according to embodiments of the invention. The dielectric patterns 4102, 4202, 4302, and 4402 have interior geometries 4106, 4206, 4306, and 4406, respectively, that affect the electroplating rate. The size of the openings in the dielectric patterns 4102, 4202, 4302, and 4402 on large bond pads may be adjusted so that the electroplating rate on the large bond pad will be substantially equivalent to the electroplating rate of a smaller bond pad permitting an integrated circuit to have both large and small bond pads that can be electroplated at the same time. The electroplating rate on large bond pads 4100, 4200, 4300, and 4400 may be adjusted to be substantially the same as the electroplating rate on the small bond pads with corresponding designs 3100, 3200, 3300, and 3400 by adjusting the size of the dielectric geometries on the large bond pads relative to the small bond pads. The size of the dielectric geometries 4106, 4206, 4306, and 4406 may be adjusted to give the desired compromise between electroplated post height and electroplated post planarity and also the desired compromise between electroplated post planarity and electroplated post current carrying capability.

The planarizing structures 4106, 4206, 4306, and 4406 on the large bond pads 4100, 4200, 4300, and 4400 may also act as a stress buffer layer and reduce the stress between the electroplated posts the bond pads. This reduction in stress improve reliability by reducing the number of stress related failures that may occur over the lifetime of the integrated circuit.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming electroplated posts with a plurality of sizes on an integrated circuit, comprising;
   providing a semiconductor substrate having a plurality of bond pads of different sizes;
   depositing a dielectric layer over said bond pads and said integrated circuit;
   etching said dielectric layer to form a first dielectric patterned structure having first openings for electroplating over said bond pads, said first dielectric patterned structure including planarizing dielectric structures over at least some of said bond pads, wherein larger bond pads have more planarizing dielectric structures defined than smaller bond pads;
   depositing a electroplating layer over said integrated circuit;
   forming second openings in said electroplating layer over said bond pads;
   electroplating a metal within said second openings and within said first openings to form said posts, wherein said planarizing dielectric structures are enclosed by said posts on at least three sides.

2. The method of claim 1 wherein said posts are formed by electroplating copper.

3. The method of claim 1 wherein the size of said planarizing structures and the number of said planarizing structures on each bond pad are adjusted so that said posts are substantially all the same height and are substantially planar after electroplating.

4. The method of claim 1 wherein said electroplating layer is photoresist.

5. The method of claim 1 wherein said electroplating layer is polyimide.

6. The method of claim 1 wherein said dielectric layer is selected from the group consisting of:
   oxide,
   nitride,
   oxynitride,
   polyimide (PI),
   polybenzoxazole (PBO), and
   benzocyclobutene.

* * * * *